US007865807B2

(12) United States Patent  
Lablans

(10) Patent No.: US 7,865,807 B2  
(45) Date of Patent: Jan. 4, 2011

(54) MULTI-VALUED CHECK SYMBOL CALCULATION IN ERROR DETECTION AND CORRECTION

(76) Inventor: Peter Lablans, 8 Harvey Ct., Morris Township, NJ (US) 07960

( * ) Notice: Subject to any disclaimer, the term of this patent is extended or adjusted under 35 U.S.C. 154(b) by 960 days.

(21) Appl. No.: 11/680,719

(22) Filed: Mar. 1, 2007

(65) Prior Publication Data

US 2007/0258516 A1 Nov. 8, 2007

Related U.S. Application Data

(63) Continuation-in-part of application No. 10/935,960, filed on Sep. 8, 2004.

(60) Provisional application No. 60/547,683, filed on Feb. 25, 2004, provisional application No. 60/779,068, filed on Mar. 3, 2006.

(51) Int. Cl.  
*H03M 13/00* (2006.01)

(52) U.S. Cl. ..................................... 714/781

(58) Field of Classification Search ................. 714/781  
See application file for complete search history.

(56) References Cited

U.S. PATENT DOCUMENTS

| 3,089,038 A * | 5/1963 | Rutz .......................... 326/134 |
| 4,553,237 A | 11/1985 | Nakamura et al. |
| 4,928,280 A | 5/1990 | Nielson et al. |
| 5,386,425 A | 1/1995 | Kim |
| 5,771,245 A | 6/1998 | Zhang |
| 6,851,086 B2 | 2/2005 | Szymanski |
| 7,000,167 B2 | 2/2006 | Coker et al. |
| 7,116,250 B2 | 10/2006 | Coene |
| 7,365,576 B2 * | 4/2008 | Lablans ...................... 326/104 |
| 2006/0282607 A1 * | 12/2006 | Lablans ...................... 711/100 |

OTHER PUBLICATIONS

Wenjing Rao, et al., Fault Tolerant Arithmetic with Applications in Nanotechnology based Systems, ITC International Test Conference 2004 Oct. 26-28, 2004, pp. 472-478, Charlotte, NC, USA.

Wong, et al. Using Multi-Dimensional Parity-Check Codes to Obtain Diversity in Rayleigh Fading Channels, URL: www.dsp.ufl.edu/~twong/Preprints/00965675.pdf, pp. 1210-1214, 2001.

Tee, et al., Multilevel generalised low-density parity-check codes, Electronics Letters, 2 pages, Feb. 2, 2006 vol. 42 No. 3.

(Continued)

*Primary Examiner*—Joseph D Torres  
(74) *Attorney, Agent, or Firm*—Diehl Servilla LLC

(57) ABSTRACT

Methods and systems for error detection and error correction in n-valued with n>2 data symbols are disclosed. N-valued check symbols are generated from data symbols in n-valued logic expressions using n-valued logic functions. N-valued Hamming codes are disclosed. Also disclosed is the generation of check symbols from data symbols in an n-valued expression wherein at least one check symbol is multiplied by a factor not equal to 0 or 1 in GF(n). Identifying n-valued symbols in error by check symbols and error correction by solving sets of independent n-valued equations are also disclosed. A method for introducing and removing annoyance errors is provided. Systems for error corrections in communication and data storage are also provided.

17 Claims, 9 Drawing Sheets

OTHER PUBLICATIONS

Bernard Sklar, A primer on turbo code concepts, IEEE Communications Magazine, Dec. 1997, p. 94-102.

XILINX LogiCORE™, IEEE 802.16 Compatible Turbo Product Code Encoder v1.0, Product Specification, Oct. 30, 2002, 5 pages.

Valles, et al., Hamming Codes Are Rate-Efficient Array Codes, IEEE Globecom 2005, p. 1320-1324.

Pohlmann, Ken C., "The Compact Disc; a handbook of theory and use", *The Computer music and digital audio series*; vol. 5 A-R Editions, Inc. Madison, WI 1989, (1989),58-61.

* cited by examiner

|  | col1 | col2 | col3 | col4 |
|---|---|---|---|---|
| row1 | d11 | d12 | d13 | q1 |
| row2 | d21 | d22 | d23 | q2 |
| row3 | d31 | d32 | d33 | q3 |
| row4 | d41 | d42 | d43 | q4 |
| row5 | d51 | d52 | d53 | q5 |
| row6 | d61 | d62 | d63 | q6 |
| row7 | p1 | p2 | p3 | q7 |

FIG. 5

|  | col1 | col2 | col3 | col4 |
|---|---|---|---|---|
| row1 | d11 | d12 | d13 | q1 |
| row2 | d21 | d22 | d23 | q2 |
| row3 | d31 | d32 | d33 | q3 |
| row4 | d41 | d42 | d43 | q4 |
| row5 | d51 | d52 | d53 | q5 |
| row6 | d61 | d62 | d63 | q6 |
| row7 | p1 | p2 | p3 | q7 |

FIG. 6

|       | col1 | col2 | col3 | col4 |
|-------|------|------|------|------|
| row1  | d11  | d12  | d13  | q1   |
| row2  | d21  | d22  | d23  | q2   |
| row3  | d31  | d32  | d33  | q3   |
| row4  | d41  | d42  | d43  | q4   |
| row5  | d51  | d52  | d53  | q5   |
| row6  | d61  | d62  | d63  | q6   |
| row7  | p1   | p2   | p3   | q7   |

FIG. 7

|       | col1 | col2 | col3 | col4 |
|-------|------|------|------|------|
| row1  | d1   | d5   | d9   | q1   |
| row2  | m1   | m5   | m9   | q2   |
| row3  | d2   | d6   | d10  | q3   |
| row4  | m2   | m6   | m10  | q4   |
| row5  | d3   | d7   | d11  | q5   |
| row6  | m3   | m7   | m11  | q6   |
| row7  | d4   | d8   | d12  | q7   |
| row8  | m4   | m8   | m12  | q8   |
| row9  | r1   | r2   | r3   | q9   |
| row10 | p1   | p2   | p3   | q10  |

FIG. 8

MULTI-VALUED CHECK SYMBOL CALCULATION IN ERROR DETECTION AND CORRECTION

CROSS-REFERENCE TO RELATED APPLICATIONS

This application is a continuation-in-part of U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS, which claims the benefit of U.S. provisional Patent Application No. 60/547,683 filed on Feb. 25, 2004. This application also claims the benefit of U.S. Provisional Application No. 60/779,068, filed Mar. 3, 2006, which is incorporated herein by reference.

BACKGROUND OF THE INVENTION

The present invention relates to error correction coding. In particular it relates to error correction by using check symbols which determine a relation between data symbols, created by applying n-valued logic functions to data symbols.

A check symbol over data bits is usually called a parity bit and is used in binary error correction or detection. It is calculated by applying a binary logic function to a number of data bits is for instance a word or sequence of bits. A parity bit is transmitted with the data bits. At the receiving side the parity bit is recalculated using the same function and data bits in identical positions in the codeword or sequence of data bits. If the received parity bit and the calculated parity bit are different one may assume that an error has occurred in at least one bit, including the parity bit.

The number of binary functions that can be applied to calculate a parity bit, and be used to correct errors, is limited to two functions, the binary XOR and EQUAL functions. As both functions are each others reverse, it does generally not make a difference if one uses one or the other.

Because of the limited number of parity functions one has to increase the number of parity bits, and thus lower the information transmission rate, to perform error correction.

N-valued codes, such as Reed-Solomon codes are known. Check symbols are generated by using in essence adders and multipliers in a Linear Feedback Shift Register. Also checksum approaches are known. Essentially all these codes go back to using binary methods and intermediary steps are required in RS codes to determine a check symbol. Like in a RS code one may add symbols to an n-valued codeword according to a coding scheme to improve the Hamming distance between codewords. However detecting and correcting errors may become quite elaborate.

Accordingly simple methods and apparatus providing a greater number of parity functions, lowering the number of check symbols and thus increasing the information transmission rate of error correcting codes or making error correction easier are required.

SUMMARY OF THE INVENTION

One aspect of the present invention presents a novel method and system that will provide n-valued symbol correction in a plurality of n-valued data symbols.

In accordance with another aspect of the present invention a method is provided for determining an n-valued check symbol with n>2 from a plurality of n-valued data symbols, comprising using a reversible n-valued logic function in an n-valued logic expression with the plurality of n-valued data symbols as variables.

In accordance with a further aspect of the present invention a method is provided for determining an n-valued check symbol using an n-valued function that is commutative, associative and self reversing.

In accordance with another aspect of the present invention a method is provided for generating a plurality of n-valued check symbols, wherein a first n-valued check symbol is generated by a first n-valued expression and a second n-valued check symbol is generated by a second n-valued expression and the first and second expression have at least one n-valued data symbol in common as variable.

In accordance with a further aspect of the present invention a method is provided for multiplying at least one variable in an n-valued expression in GF(n) not leading to 0 or to identity and not using an LFSR.

In accordance with another aspect of the present invention a method is provided for generating a plurality of n-valued check symbols, wherein a first n-valued check symbol is generated by a first n-valued expression and a second n-valued check symbol is generated by a second n-valued expression and the first and second expression have at least one n-valued data symbol in common as variable.

In accordance with a further aspect of the present invention a method is provided for wherein n-valued check symbols are created according to a Hamming code.

In accordance with another aspect of the present invention a method is provided for error correcting up to k errors in a codeword having r n-valued data symbols, comprising the steps of creating k n-valued check symbols, each check symbol generated by one of k n-valued expressions each with at least two of the r n-valued data symbols as variables and each expression applying a reversible n-valued logic function, wherein the k n-valued expressions form an independent set of equations for solving k unknowns; and creating a first codeword comprising r n-valued data symbols and k n-valued check symbols.

In accordance with a further aspect of the present invention a method is provided for multiplying at least one of the r n-valued symbols in the n-valued expression in GF(n) not leading to 0 or to identity and not using an LFSR.

In accordance with another aspect of the present invention a method is provided for creating at least r n-valued additional check symbols, each of the r additional check symbols depending on one of the r n-valued data symbols as a variable; and providing the at least r data symbols and the r+k check symbols on an output.

In accordance with a further aspect of the present invention a method is provided for re-calculating check symbols.

In accordance with another aspect of the present invention a method is provided for comparing transferred check symbols with re-calculated check symbols; and identifying if an error has occurred in the first codeword.

In accordance with a further aspect of the present invention a method is provided for identifying which of up to k n-valued symbols in the first codeword are in error.

In accordance with another aspect of the present invention a method is provided for making the up to k identified symbols in error in the first codeword unknowns in k n-valued expressions for generating n-valued check symbols; and solving the set of k equations for the unknowns.

In accordance with a further aspect of the present invention a system is provided for implementing the methods herein provided as different aspects of the present invention.

In accordance with another aspect of the present invention the system herein provided as an aspect of the present invention is a communication system.

In accordance with a further aspect of the present invention the system herein provided as an aspect of the present invention is a data storage system.

In accordance with another aspect of the present invention a method is provided for creating and solving annoyance errors.

DESCRIPTION OF THE DRAWINGS

FIG. 5 shows a matrix for arranging n-valued data symbols and check symbols.

FIG. 6 shows another matrix for arranging n-valued data symbols and check symbols.

FIG. 7 shows yet another matrix for arranging n-valued data symbols and check symbols.

FIG. 8 shows yet another matrix for arranging n-valued data symbols and check symbols.

DESCRIPTION OF A PREFERRED EMBODIMENT

Figure 1:
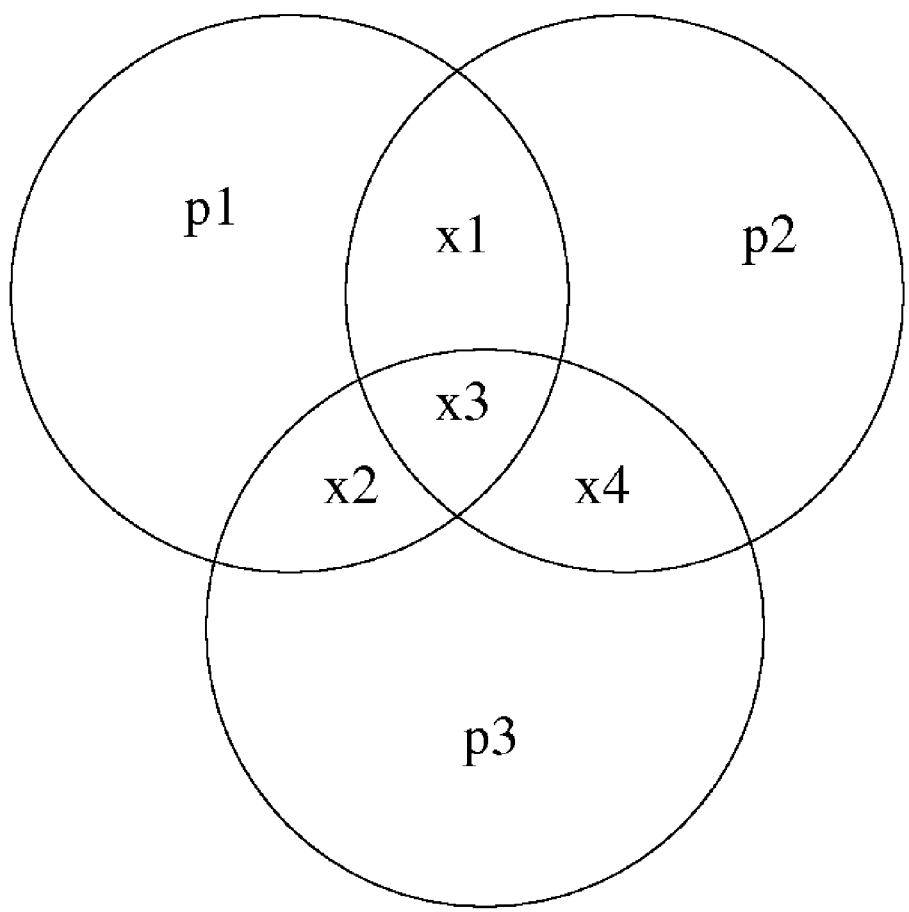
FIG. 1 shows a Venn diagram for a n-valued (7,4) Hamming code.

The term n-valued herein is used as non-binary wherein n>2. Herein also the term check symbol is used. In binary applications one generally uses the term parity bit or symbol. Because the binary check function is the XOR function a check symbol generated by the XOR function is a 0 if there was an even number of 1s and a 1 if there was an odd number of 1s. Hence the name parity. The name parity has no such meaning in n-valued functions. Accordingly the name check symbols will be used.

Parity calculation in binary error correction is the process wherein a number of bits in a codeword or sequence or block have for instance an even parity or even number of 1s, including the parity bit. Assume one has an 8 bit code word [a b c d e f g h] and a parity bit p is added. For instance a rule for determining a parity symbol could be: the number of 1s in [a b c d e f g h p] should always be even.

This can be expressed in the equation a+b+c+d+e+f+g+h+p=0. The operation '+' in this equation is the modulo-2 addition or XOR function.

It is one aspect of the present invention to create a check symbol for a codeword comprised of k n-valued symbols by using a reversible n-valued operation sc1. In n-valued logic one may use different ways or functions to create a 'parity' or check symbol. One may use reversible and non-reversible operations. For instance a non-reversible parity n-valued operation is one wherein a 1 is added (modulo-n) to a sum when a symbol is not 0, and a 0 when a symbol is zero. The reversibility is related to determining the original value of the symbols of which a parity symbol is determined.

One method as an aspect of the present invention is to apply reversible n-valued logic operations to calculate the 'check' or parity symbol of a sequence of n-valued symbols. The advantage of a reversible operation is that an equation can be solved. For instance two n-valued symbols x1 and x2 combined by a function sc1 will generate a symbol p1 according to the equation: x1 sc1 x2=p1.

Assume that sc1 is self reversing and commutative. In that case (as is for instance explained in U.S. patent application Ser. No. 10/912,954 filed Aug. 6, 2004 entitled: Ternary and higher multi-value digital scramblers/descramblers, which is incorporated herein in its entirety): x1=p1 sc1 x2. For calculation and notation purposes it is sometimes preferred to write the parity symbol equations with a result 0. In that case (x1 sc1 x2=0) can be written for instance as: (x1 sc1 x2 sc1 p1)=0. This is the result of (x1 sc1 x2)=(p1 sc1 0) again with sc1 assumed to be a commutative self-reversing n-valued function.

It should be clear that p1 can also be calculated in a different fashion. For instance by: (x1 sc1 x2)=(p1 sc2 0) so that ((x1 sc1 x2) sc3 p1)=0. Herein the function sc3 is the reverse of sc2. If sc2 is self-reversing then:

((x1 sc1 x2) sc2 p1)=0.

It is important to note that the n-valued self-reversing functions are in general not associative. This means that even though a function may be commutative, the order of variables in a multi-variable equation does matter. The expression (x1 sc1 x2 sc2 p1) should be evaluated as {(x1 sc1 x2) sc2 p1}. In words: first evaluate (x1 sc1 x2) as 'term' and then {term sc2 p1}. Assuming sc1 and sc2 being commutative one will get the same results by evaluation {p1 sc2 (x1 sc1 x2)} or {p1 sc2 (x2 sc1 x1)} or {(x2 sc1 x1) sc2 p1}.

To demonstrate the above one may apply two functions: sc1 and sc2, which are self-reversing and commutative. For instance one can use two 4-valued switching functions sc1 and sc2 of which the truth tables are provided below.

| sc1 | 0 | 1 | 2 | 3 |
|---|---|---|---|---|
| 0 | 3 | 2 | 1 | 0 |
| 1 | 2 | 1 | 0 | 3 |
| 2 | 1 | 0 | 3 | 2 |
| 3 | 0 | 3 | 2 | 1 |

| sc2 | 0 | 1 | 2 | 3 |
|---|---|---|---|---|
| 0 | 1 | 0 | 3 | 2 |
| 1 | 0 | 3 | 2 | 1 |
| 2 | 3 | 2 | 1 | 0 |
| 3 | 2 | 1 | 0 | 3 |

Assume x1=1 and x2=2. Then (x1 sc1 x2)=0 according to the truth table of sc1. If one wants (x1 sc1 x2) (p1 sc1 0) then p1=3. Or (x1 sc1 x2 sc1 p1)=0. For instance (x1 sc1 p1) in this case is (1 sc1 3)=3. And (x2 sc1 3)=(2 sc1 3)=2 which is different from 0. So the expression is not associative. However the expression is reversible when one observes the order of the variables.

For illustrative purposes the associative 4-valued function sc3 is also provided in the following truth table.

| Sc3 | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

It is easy to check that (x1 sc3 x2 sc3 p1)=0 will apply if (x1 sc3 x2)=p1.

Error-Correction

Two different functions allow for error correction of at least one symbol after transmission of a block of 4 symbols of which 2 symbols are 'check' or parity symbols. The 'check' symbols are created by applying different n-valued functions to two n-valued information symbols. For instance in the 4-valued case the following is applied. Assume two information symbols x1 and x2. From these symbols two 4-valued 'check' symbols are created: p1 and p2 according to the two n-valued functions sc1 and sc2 with:

p1=(x1 sc1 x2) and p2=(x1 sc2 x2).

One can then transmit the 4 symbols word [x1 x2 p1 p2] and identify and correct one transmission error. The critical issue here is to select sc1 and sc2 in such a way that a combination of (p1, p2) completely determines the generating information symbols x1 and x2. This can be done in the following way:

1. Before transmission of the information symbols, p1 and p2 are calculated from symbols x1 and x2 and added to the transmitted symbols into a 4 symbol word [x1 x2 p1 p2]. Consequently the information transmission rate has been halved.

2. One will receive the 4 symbol word [x1r x2r p1r p2r]. At reception the check symbols are recalculated from x1r and x2r using the known functions. The symbols x1r and x2r are the received information symbol, of which one may contain an error. One can then calculate p1r and p2r according to:

p1r=(x1r sc1 x2r) and p2r=(x1r sc2 x2r).

3. If p1r=p1 and p2r=p2 it may be assumed that no error has occurred (again under the assumption that only one error may have occurred).

4. If p1r≠p1 or p2r≠p2 then an error has occurred during transmission in either p1 or p2. Because the assumption is that only one error occurs in [x1 x2 p1 p2], combined with how p1 and p2 are calculated, the only way that only p1 or p2 has an error can be that only one of these check symbols has experienced a transmission error. If either x1 or x2 had experienced a transmission error then both p1r and p2r would be different from p1 and p2. So x1r and x2r may in that case be assumed to be identical to x1 and x2.

5. If both p1r and p2r calculated from x1r and x2r are different from p1 and p2 then it is clear that either x1r≠x1 or that x2r≠x2. In this case p1r=p1 and p2r=p2, because only one error is assumed to have occurred. And that error took place in one of the information symbols.

As an illustrative example sc1 is selected to be the modulo-3 addition and sc2 a modulo-3 subtraction.

| sc1 | 0 | 1 | 2 |
|---|---|---|---|
| 0 | 0 | 1 | 2 |
| 1 | 1 | 2 | 0 |
| 2 | 2 | 0 | 1 |

| sc2 | 0 | 1 | 2 |
|---|---|---|---|
| 0 | 0 | 2 | 1 |
| 1 | 1 | 0 | 2 |
| 2 | 2 | 1 | 0 |

The following table provides all possible check symbols p1 and p2 as a result of x1 and x2.

| p1 | p2 | x1 | x2 |
|---|---|---|---|
| 0 | 0 | 0 | 0 |
| 1 | 2 | 0 | 1 |
| 2 | 1 | 0 | 2 |
| 1 | 1 | 1 | 0 |
| 2 | 0 | 1 | 1 |
| 0 | 2 | 1 | 2 |
| 2 | 2 | 2 | 0 |
| 0 | 1 | 2 | 1 |
| 1 | 0 | 2 | 2 |

From the above table one can see that each combination of (p1, p2) maps into a unique combination of (x1, x2). Assume that the sequence [x1r x2r p1r p2r]=[1 2 2 1] was received. When one calculates p1=(x1r sc1 x2r) one gets p1=0. From p2=(x1r sc2 x2r) one gets p2=2. Clearly that is different from p1r=2 and p2r=1. With two check symbols in error (assuming maximum a single error) it means that either x1r or x2r is in error, but that p1r and p2r may assumed to be correct. The correct information symbols according to the matching table is [x1 x2]=[0 2]. This means that x1r was in error. The underlying requirement for this method of error-correcting coding to work is that each combination of (x1, x2) generates by using sc1 an output p1 and by using sc2 an output p2 in such a way that each combination (x1, x2) in fact generates a unique combination of (p1, p2). In fact (x1, x2) are reversible combinations: when (p1, p2) is known then (x1, x2) is known. And when (x1, x2) is known then (p1, p2) is known.

Another requirement is that the creation of p1 and p2 applies functions in such a way that when either x1 or x2 change then both p1 and p2 have to change. If that is not the case then under the condition of one symbol error it may not be possible to correct the occurring error. This condition applies to all n-valued symbols. The underlying reason is that for n>2 each word of 4 symbols has only 1 symbol in common with another word of 4 symbols. The positive side of this condition is that one can apply shifted versions of the truth tables of sc1 or sc2 for creating the functions to generate the n-valued check symbols. For instance in the ternary case one can shift all rows in the truth table of the modulo-3 add function sc1 one position up and put the top row of the modulo-3 add function on the bottom of the new truth table. One may leave the truth table of sc2 unchanged.

The result is shown in the new truth tables of sc1 and sc2.

| sc1 | 0 | 1 | 2 |
|-----|---|---|---|
| 0   | 1 | 2 | 0 |
| 1   | 2 | 0 | 1 |
| 2   | 0 | 1 | 2 |

| sc2 | 0 | 1 | 2 |
|-----|---|---|---|
| 0   | 0 | 2 | 1 |
| 1   | 1 | 0 | 2 |
| 2   | 2 | 1 | 0 |

The table of (x1, x2) and (p1, p2) under p1=x1 sc1 x2 and p2=x1 sc2 x2 is provided in the following table:

| p1 | p2 | x1 | x2 |
|----|----|----|----|
| 1  | 0  | 0  | 0  |
| 2  | 2  | 0  | 1  |
| 0  | 1  | 0  | 2  |
| 2  | 1  | 1  | 0  |
| 0  | 0  | 1  | 1  |
| 1  | 2  | 1  | 2  |
| 0  | 2  | 2  | 0  |
| 1  | 1  | 2  | 1  |
| 2  | 0  | 2  | 2  |

One should take care in determining p1 and p2 as both sc1 and sc2 are non-commutative and the input order of x1 and x2 does make a difference when switched. However the new function sc1 also can serve as a function to determine a check symbol p1 and allows for error correction.

Other examples will also be provided. It should be clear that any word [x1 x2 p1 p2] in the above table only has 1 symbol in common in a similar position with any other codeword. In one way the use of symbols is inefficient. Only 9 codewords are created while 81 codewords are possible. If an error occurs in a codeword, the word with an error has at most 2 symbols in common with any other codeword. However a codeword with one error still has 3 symbols in common with its error free codeword. Accordingly a Maximum Likelihood detection scheme can be created. Rather than check a received codeword against all possible codewords, it is easier to execute functions on symbols to find if errors have occurred and then determine the correct word by using deterministic expressions.

In the following examples other n-valued functions will be demonstrated that can be used to create and recalculate check symbols. It is required that the n-valued functions sc1 and sc2 as provided in the example and applied to two n-valued variables x1 and x2 will generate the check symbols in such a way that:

each combination of (x1, x2) will generate a unique combination (p1, p2);

if only either x1 or x2 changes in (x1, x2) then both p1 and p2 change in value.

One may use the modulo-n addition and a modulo-n subtraction function for determining error symbols in the above manner for n-valued logic wherein n is a prime number except n=2. It should be appreciated that addition and subtraction functions in binary and extended binary finite fields are identical. For example one can create the n-valued symbol error correction method for a 5-valued logic and 5-valued symbols. The functions sc1 and sc2 in 5-valued form are provided in the following truth tables.

| sc1 | 0 | 1 | 2 | 3 | 4 |
|-----|---|---|---|---|---|
| 0   | 0 | 1 | 2 | 3 | 4 |
| 1   | 1 | 2 | 3 | 4 | 0 |
| 2   | 2 | 3 | 4 | 0 | 1 |
| 3   | 3 | 4 | 0 | 1 | 2 |
| 4   | 4 | 0 | 1 | 2 | 3 |

| sc2 | 0 | 1 | 2 | 3 | 4 |
|-----|---|---|---|---|---|
| 0   | 0 | 4 | 3 | 2 | 1 |
| 1   | 1 | 0 | 4 | 3 | 2 |
| 2   | 2 | 1 | 0 | 4 | 3 |
| 3   | 3 | 2 | 1 | 0 | 4 |
| 4   | 4 | 3 | 2 | 1 | 0 |

| p1 | p2 | x1 | x2 |
|----|----|----|----|
| 0  | 0  | 0  | 0  |
| 1  | 4  | 0  | 1  |
| 2  | 3  | 0  | 2  |
| 3  | 2  | 0  | 3  |
| 4  | 1  | 0  | 4  |
| 1  | 1  | 1  | 0  |
| 2  | 0  | 1  | 1  |
| 3  | 4  | 1  | 2  |
| 4  | 3  | 1  | 3  |
| 0  | 2  | 1  | 4  |
| 2  | 2  | 2  | 0  |
| 3  | 1  | 2  | 1  |
| 4  | 0  | 2  | 2  |
| 0  | 4  | 2  | 3  |
| 1  | 3  | 2  | 4  |
| 3  | 3  | 3  | 0  |
| 4  | 2  | 3  | 1  |
| 0  | 1  | 3  | 2  |
| 1  | 0  | 3  | 3  |
| 2  | 4  | 3  | 4  |
| 4  | 4  | 4  | 0  |
| 0  | 3  | 4  | 1 |
| 1  | 2  | 4  | 2  |
| 2  | 1  | 4  | 3  |
| 3  | 0  | 4  | 4  |

From the table one can see that each combination of 5-valued check symbols maps uniquely into a combination of 5-valued information symbols. Similar examples can be provided for n-valued sequences [x1 x2 p1 p2] wherein n is a prime number and p1 and p2 are parity or check symbols generated by applying n-valued functions to x1 and x2.

A problem may arise when n is not prime. For instance when n=4. In that case the combination of sc1 is modulo-4 addition and sc2 is a modulo-4 subtraction will not generate combinations of (p1, p2) that map uniquely into (x1, x2). The case of n=4 and for instance n=8 are important because it may then be possible to consider combinations of multiple bits representing an n-valued symbol. For instance 2 bits represent a 4-valued symbol and 3 bits an 8-valued symbol, etc.

Though one can apply the same approach of coding an n-symbol by bits wherein n is prime, it does not fully use the coding capacity of a channel. The solution to the problem of $q^n$ valued symbols wherein q is prime and n is an integer, is to consider sc1 and sc2 as operations in the extended Galois Field $GF(q^n)$.

As example 4-valued symbols will be considered first. The function sc1 is the addition is the extended field $GF(2^2)$. Its truth table is provided in the following table.

| sc1 | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

The function sc2 has to be constructed in such a way that an input (x1, x2) to sc1 generates a value p1=(x1 sc1 x2) and inputted to sc2 will generate p2=(x1 sc2 x2) so that each combination of (p1, p2) points uniquely to an input (x1, x2).

| sc2 | 0 | 1 | 2 | 3 |
|---|---|---|---|---|
| 0 | 0 | 2 | 3 | 1 |
| 1 | 1 | 3 | 2 | 0 |
| 2 | 2 | 0 | 1 | 3 |
| 3 | 3 | 1 | 0 | 2 |

It should be clear that sc2 is not commutative.

The mapping of p1 and p2 into x1 and x2 is provided in the following table, using again the expressions: p1=x1 sc1 x2; and p2=x1 sc2 x2.

| p1 | p2 | x1 | x2 |
|---|---|---|---|
| 0 | 0 | 0 | 0 |
| 1 | 2 | 0 | 1 |
| 2 | 3 | 0 | 2 |
| 3 | 1 | 0 | 3 |
| 1 | 1 | 1 | 0 |
| 0 | 3 | 1 | 1 |
| 3 | 2 | 1 | 2 |
| 2 | 0 | 1 | 3 |
| 2 | 2 | 2 | 0 |
| 3 | 0 | 2 | 1 |
| 0 | 1 | 2 | 2 |
| 1 | 3 | 2 | 3 |
| 3 | 3 | 3 | 0 |
| 2 | 1 | 3 | 1 |
| 1 | 0 | 3 | 2 |
| 0 | 2 | 3 | 3 |

As an example of this 4-valued method assume that [x1r x2r p1r p2r]=[1 0 3 2] was received. The information symbols [x1r x2r]=[1 0] would generate [p1 p2]=[1 1]. Clearly that is not the case and two check symbols are in error. That means (assuming that only one of the 4 received symbols can be in error) that the combination [p1r p2r]=[3 2] is correct and that [x1 x2] was [1 2]. So x2r was received in error.

Because both sc1 and sc2 are reversible functions and only one error can occur one can of course also correct the error by calculating x1 and x2 from p1r and p2r. It was determined that the parity symbols are correct, but one of the data symbols is in error. Because (x1r sc1 x2r=p1r) and (x1r sc2 x23=p2r) one can restate the equations as: x1r=x2r sc1 p1r and x2r=x1r sc1 p1r; and x1r=x2r sc3 p2r and x2r=x1r sc4 p2r. The function sc1 is self reversing, commutative and associative. The function sc2 is not associative, non-commutative and only self reversing as p2r sc2 x2r=x1r. In general there are no easy algebraic solutions to solve equations where the functions are defined by truth tables.

One way to solve this by truth tables is to compare the relevant columns and rows. For instance: x1r=p2r sc2 x2r; or (x1r=2 sc2 x2r). Also (x1r=x2r sc1 p1r) or (x1r=x2r sc1 3). This means that (x2r sc1 3)=(2 sc2 x2r). One should be aware that the expression (a sc b=c) based on a truth table of function 'sc' means that the result 'c' can be found by selecting row 'a' and column 'b' in the truth table. (x2r sc1 3) then means the column of truth table sc1 under 3, which is [3 2 1 0]. x2r is the position of a symbol in this vector. Though it is a column it is here shown as a row. (2 sc2 x2r) indicates the row in the truth table of sc2 for row number is 2; this is [2 0 1 3]. The equation requires finding a position in both vectors for which the symbol in both vectors have the same symbol. This is the position 2, or x2r=2, for which the symbol will be 1. Because of the equations when p2r=2 and x2r=2 then x1r=1.

In accordance with a further aspect of the present invention in the error correcting approach symbols may be represented in binary form by bits. It is fully conceivable that even though an error will only affect the number of bits representing one symbol that bit errors will spill over from one symbol into another. In other words, part of the bit errors affect one symbol and the other part affect an adjacent symbol. There are different methods to correct multiple symbol errors. However one approach can be to interleave two error correcting sequences.

For instance assume that one sequence is [x1 x2 p1 p2] wherein x1 and x2 are information symbols and p1 and p2 are check symbols. One can code a second sequence [y1 y2 q1 q2] wherein y1 and y2 are information symbols and q1 and q2 are check symbols. One can then interleave the two sequences as [x1 y1 x2 y2 p1 q1 p2 q2]. When the symbols are coded as bits, errors that affect two neighboring symbols can still be corrected, assuming that no more than two neighboring symbols can contain an error.

In accordance with a further aspect of the present invention the method of creating multi-valued check symbols can also be applied to multi-valued Hamming codes. Binary Hamming codes are known and q-ary Hamming codes with q>2 are known. However q-ary Hamming codes are commonly developed in the context of independency properties of their parity matrix. An example of this is provided in The Hamming Codes and Delsarte's Linear Programming Bound, by Sky McKinley, the Master of Science in Mathematics Thesis, Portland University, May, 2003. This approach makes designing q-ary Hamming codes fairly difficult especially for higher values of q and for codes with a significant number of symbols.

The way to construct a binary Hamming code is known and well documented. It applies using powers of 2 to determine data and parity bits in a codeword. In a related known method a Venn-diagram is created, from which one visually can determine relations between parity bits and data bits. Instead of using bits, the Venn diagram will be used to determine n-valued check symbol. A check symbol in the context of the present invention is broader than a parity symbol. A parity symbol assumes some relation between symbols such as bits (for instance polarity). A check symbol is considered a result of an n-valued expression which depends from data symbols. In an additional limitation for n-valued Hamming codes one may limit the expression to create the check symbol to not involving n-valued multipliers or n-valued inverters. N-valued check symbols are known to be created in Reed Solomon codes, using Linear Feedback Shift Registers. Because these check symbols are created in a recursive fashion, they will comprise multipliers and fall outside one of the previous definitions here provided for a check symbol.

FIG. 1 shows a Venn diagram for creating an n-valued (7,4) Hamming code, involving four data symbols [x1 x2 x3 x4] and three check symbols [p1 p2 p3]. The Venn diagram provides the following relations: p1=f(x1, x2, x3), p2=g(x1, x3, x4) and p3=h(x2, x3, x4). The functions f, g and h represent n-valued expressions. While for simplicity one may use the same function for determining each check symbol it is not required. One requirement that has to be met by each function as an aspect of the present invention is that every expression should be reversible so that x1=fr1(p1, p2, p3), x2 fr2(p1, p2, p3), x3=fr3(p1, p2, p3) and x4=fr4(p1, p2, p3).

The functions fr1, fr2, fr3 and fr4 can be derived from reversible functions f, g and h. An example will be provided.

In general manipulating n-valued functions that are defined by truth tables, rather than for instance arithmetical functions in analytical form, can be more complicated and care should be taken with order of variables, order of execution and determining the reverse of such a function. One of the exceptions to this rule is using an addition defined over a finite field $GF(2^p)$ which is an extended binary field. An example of such a function is the modulo-2 addition over GF(2). This function is commutative, associative and self-reversing. As such $sc=sc^{-1}$; $sc=sc^T$ and (a sc b) sc c=a sc (b sc c).

Assuming the advantageous properties do not exist, one has then to carefully observe the rules for manipulating expressions. For instance in case of a non-commutative function: (a sc b)=(b $sc^T$ a). In the non-commutative case sc is different from $sc^T$. The difference shows itself in the truth table of a function. Determining $sc^T$ from sc is easily done by exchanging rows and columns. Determining $sc^{-1}$ from sc is a bit more difficult. Each expression (a sc b)=c has two inverse expressions. In order to create a common rule, it is assumed that the expression (a sc b) is described by a truth table of which the variable 'a' is determined by the rows of the truth table and variable 'b' is determined by the columns. The value 'c' is the value at a position in the truth table determined by row and column.

As a simple example the truth table of the ternary addition modulo-3 is provided in the following table.

| sc | 0 | 1 | 2 |
|---|---|---|---|
| 0 | 0 | 1 | 2 |
| 1 | 1 | 2 | 0 |
| 2 | 2 | 0 | 1 |

This function is commutative. There are however two inverting functions to sc. In arithmetical form (a+b)=c. Its first reverse is (a $scr^{-1}$ c)=b, and its second reverse is (c $scc^{-1}$ b)=a. The first reversing function is created by keeping 'a' (or the rows) constant, while reversing the columns. In other words: the rows of sc will be replaced by the inverter of those rows. This provides the following truth table:

| $scr^{-1}$ | 0 | 1 | 2 |
|---|---|---|---|
| 0 | 0 | 1 | 2 |
| 1 | 2 | 0 | 1 |
| 2 | 1 | 2 | 0 |

One can easily check that the first row of $scr^{-1}$ is the reverse of the first row of sc ([0 1 2] inverts itself). The reverse of the second row of sc [1 2 0] is [2 0 1] which is now the second row of $scr^{-1}$. And the reverse of [2 0 1] is [1 2 0]. One can check the result by applying the expressions.

The truth table of $scc^{-1}$ can be determined by reversing the truth table over constant columns. This means that one can create the truth table of $scc^{-1}$ by reversing the columns of sc. This provides the following truth table:

| $scr^{-1}$ | 0 | 1 | 2 |
|---|---|---|---|
| 0 | 0 | 2 | 1 |
| 1 | 1 | 0 | 2 |
| 2 | 2 | 1 | 0 |

For instance to solve an expression p1=(x1 sc1 x2) sc2 x3 for x1 to be unknown wherein n-valued logic functions are non-commutative, non-associative and non self reversing:

p1=(x1 sc1 x2) sc2 x3→(x1 sc1 x2)=(p1 $sc2c^{-1}$ x3)→x1=(p1 $sc2c^{-1}$ x3) $sc2c^{-1}$ x2.

As an example the following rules based on a ternary Hamming code according to the Venn diagram of FIG. 1 are provided:

p1=x1 sc x2 sc x3 p2=x1 sc x3 sc x4 p3=x2 sc x3 sc x4

The function sc here is the ternary mod-3 addition. The following rules apply for a single error detection: (p1, p2, ~p3) then symbol x1 is error; (p1, ~p2, p3) then symbol x2 in error; (p1, p2, p3) then symbol x3 in error; and (~p1, p2, p3) then symbol x4 is in error. herein p1 means p1 received and p1 recalculated are different and (~p1) means p1 received and p1 recalculated are identical. If only one of p1, p2 or p3 is in error then only the check symbol is in error and all other symbols are correct. All of the above is under the assumption that only one error occurs.

Assume [x1 x2 x3 x4]=[0 1 2 2] then [p1 p2 p3]=[0 1 2]. Assume further that [x1r x2r x3r x4r p1r p2r p3r]=[2 1 2 2 0 1 2] wherein the r indicates a received symbol. Accordingly one can calculate the check symbols p1c=x1r sc x2r sc x3r=2; p2c=0 and p3c=2. Clearly this is the situation (p1, p2, ~p3) and accordingly symbol x1 is in error. For that situation one can determine x1=p1 $scc^{-1}$ (x2 sc x3)=0 $scc^{-1}$ 0=0.

One can make the calculations a bit easier by using a self reversing, commutative ternary function sc3 of which the truth table is provided in the following table.

| sc3 | 0 | 1 | 2 |
|---|---|---|---|
| 0 | 2 | 1 | 0 |
| 1 | 1 | 0 | 2 |
| 2 | 0 | 2 | 1 |

While commutative and self reversing the function sc3 is not associative. So one should be careful with order of execution of the terms of an expression. Using self reversing functions is especially beneficial in longer expressions.

An example is provided using the ternary function sc3 and the following relations in a (7,4) ternary Hamming code:

p1=(x1 sc x2) sc x3 p2=(x1 sc x3) sc x4 p3=(x2 sc x3) sc x4. The function sc3 is not associative.

Assume [x1 x2 x3 x4]=[0 1 2 2] then [p1 p2 p3] [2 0 1]. Assume further, as in a previous example that [x1r x2r x3r x4r p1r p2r p3r]=[2 1 2 2 2 0 1] wherein the r indicates a received symbol. Accordingly one can calculate the check symbols p1c=x1r sc x2r sc x3r=1; p2c=2 and p3c=1. This is the situation (p1c, p2c, ~p3c) wherein p1c means p1c in error and ~p3c means p3c not in error. Accordingly symbol x1 is in error. One can determine x1 from for instance p1=(x1 sc3 x2) sc x3. Because (p1 sc3 x3) (x1 sc3 x2)→(p1 sc3 x3) sc3 x2=x1 or →x1=(2 sc3 2) sc3 1 or x1=0.

Because only one symbol can be in error, it really does not matter which reversible function one uses. The requirements for an n-valued (n,k) code then may be: each of the k data symbols in a n-valued Hamming codeword should be a function of at least 2 check symbols. There are (n-k) check symbols. One check symbol in error should mean just that: only one check symbol and no data symbol is in error. No check symbol in error means that no single error has occurred. What one does with a Hamming code is mapping each state of a codeword into a unique word formed by check symbols. For a (7,4) n-valued Hamming code:

x1=p1, p2, ~p3 x2=p1, p2, ~p3 x3=p1, p2, p3 x4=~p1, p2, p3 no error=~p1, ~p2, ~p3 p1 in error=p1, ~p2, ~p3 p2 in error=~p1, p2, ~p3 p3 in error=~p1, ~p2, p3

Accordingly all 8 combinations of p1, p2 and p3 are used.

As another illustrative example an 8-valued (11,7) Hamming code will be provided. Herein an addition over GF(8) sc8 will be used as the 8-valued function to determine the 4 check symbols p1, p2, p3 and p4 from the 7 8-valued data symbols [x1 x2 x3 x4 x5 x6 x7]. The truth table of sc8 is provided in the following table.

| sc8 | 0 | 1 | 2 | 3 | 4 | 5 | 6 | 7 |
|-----|---|---|---|---|---|---|---|---|
| 0 | 0 | 1 | 2 | 3 | 4 | 5 | 6 | 7 |
| 1 | 1 | 0 | 4 | 7 | 2 | 6 | 5 | 3 |
| 2 | 2 | 4 | 0 | 5 | 1 | 3 | 7 | 6 |
| 3 | 3 | 7 | 5 | 0 | 6 | 2 | 4 | 1 |
| 4 | 4 | 2 | 1 | 6 | 0 | 7 | 3 | 5 |
| 5 | 5 | 6 | 3 | 2 | 7 | 0 | 1 | 4 |
| 6 | 6 | 5 | 7 | 4 | 3 | 1 | 0 | 2 |
| 7 | 7 | 3 | 6 | 1 | 5 | 4 | 2 | 0 |

The function sc8 is commutative, self-reversing and associative. The check symbols are created from:

p1=x1 sc8 x2 sc8 x4 sc8 x5 sc8 x7 p2=x1 sc8 x3 sc8 x4 sc8 x6 sc8 x7 p3=x2 sc8 x3 sc8 x4 p4=x5 sc8 x6 sc8 x7

Figure 2:
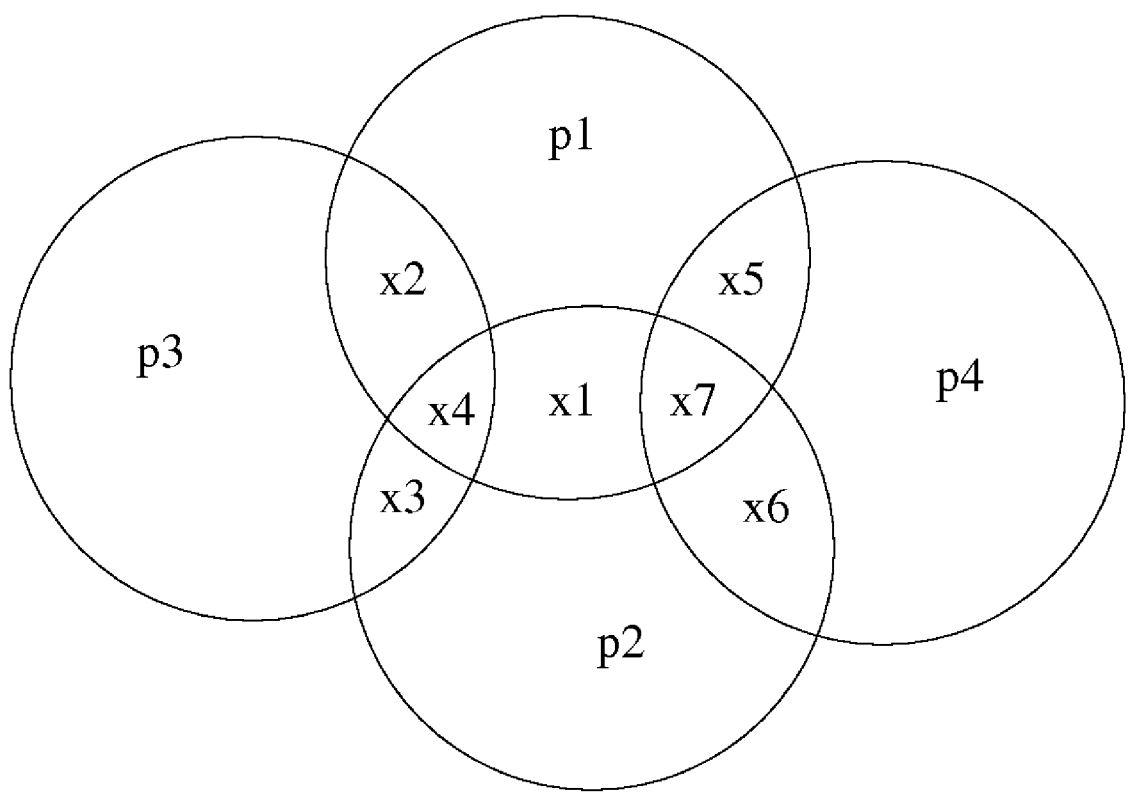
FIG. 2 shows a Venn diagram for a n-valued (11,7) Hamming code.

The dependency of data symbols on check symbols is then:

x1=function of (p1, p2, ~p3, ~p4)

x2=function of (p1, ~p2, p3, ~p4)

x3=function of (~p1, p2, p3, ~p4)

x4=function of (p1, p2, p3, ~p4)

x5=function of (p1, ~p2, ~p3, p4)

x6=function of (~p1, p2, ~p3, p4)

x7=function of (p1, p2, ~p3, p4)

no errors (p1, p2, p3, p4)

and individual errors of p1, p2, p3 and p4. Only 12 of 16 possible words of check symbols are used. No parentheses are required in the expressions because sc8 is associative. The Venn-diagram for creating a possible (11,7) n-valued Hamming code is provided in FIG. 2. While creating a (11,7) binary Hamming code is known, creating a 911,7) 8-valued Hamming code is believed to be novel to the inventor.

As an example assume the data word [x1 x2 x3 x4 x5 x6 x7]=[0 1 2 3 4 5 7]. This will create a word of check symbols [p1 p2 p3 p4]=[4 7 6 0]. Assume a received word is [0 1 2 5 4 5 7 4 7 6 0]. Using the data symbols it will generate check symbols generated from received symbols [p1r p2r p3r p4r]=[1 6 7 0]. Comparing [p1r p2r p3r p4r] with [4 7 6 0] shows that only p4r is correct. That is the situation (p1, p2, p3, ~p4), which means x4 is in error. This data symbol can be calculated from x4=p3 sc8 x2 sc8 x3, which will generate x4=3.

It should be clear from the expression p1=x1 sc8 x2 sc8 x4 sc8 x5 sc8 x7 why associative functions are preferred. It is much easier for reversing the expression to calculate x1 for instance.

Figure 3:
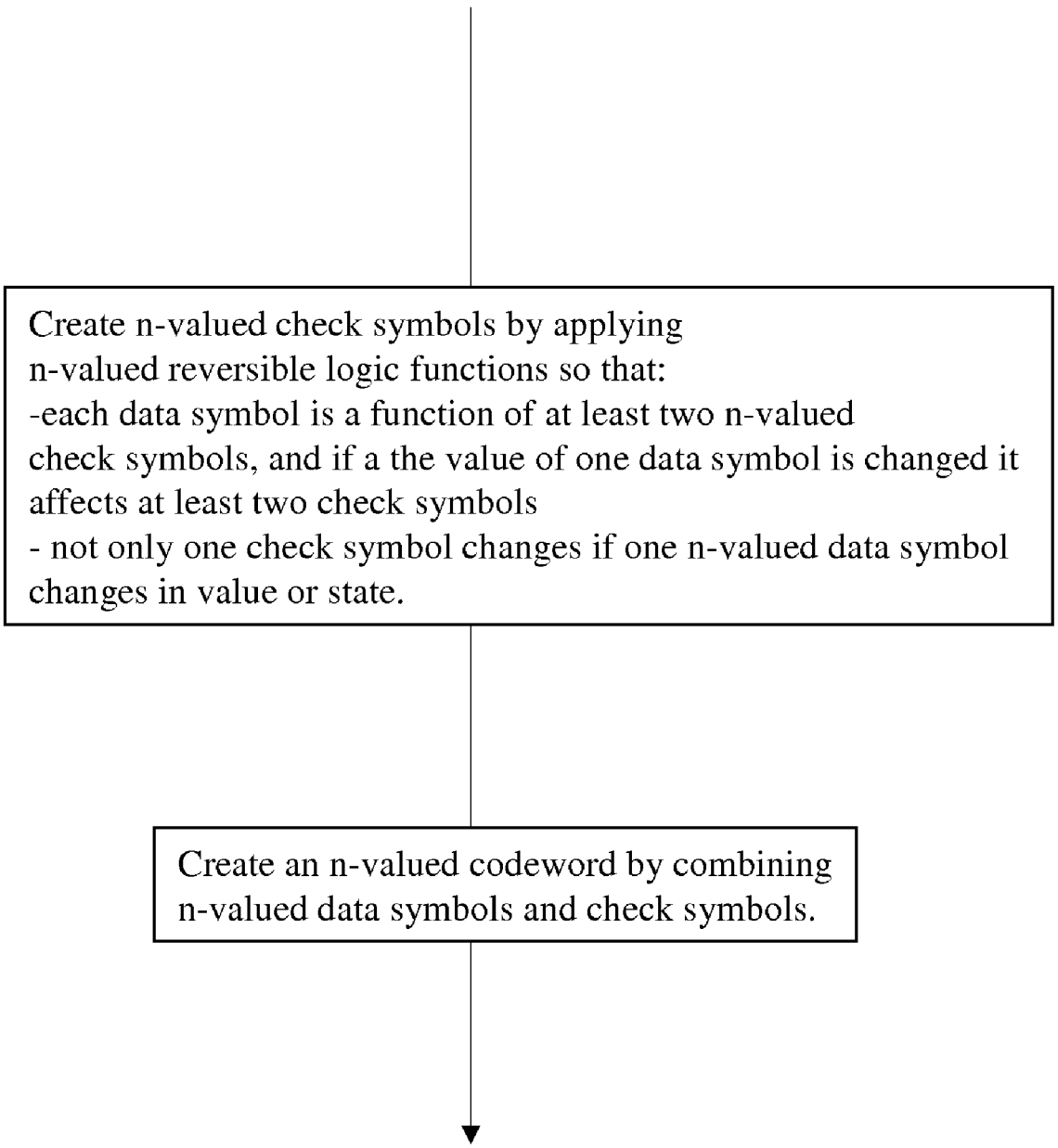
FIG. 3 illustrates in a flow diagram a method of creating a n-valued codeword.
Figure 4:
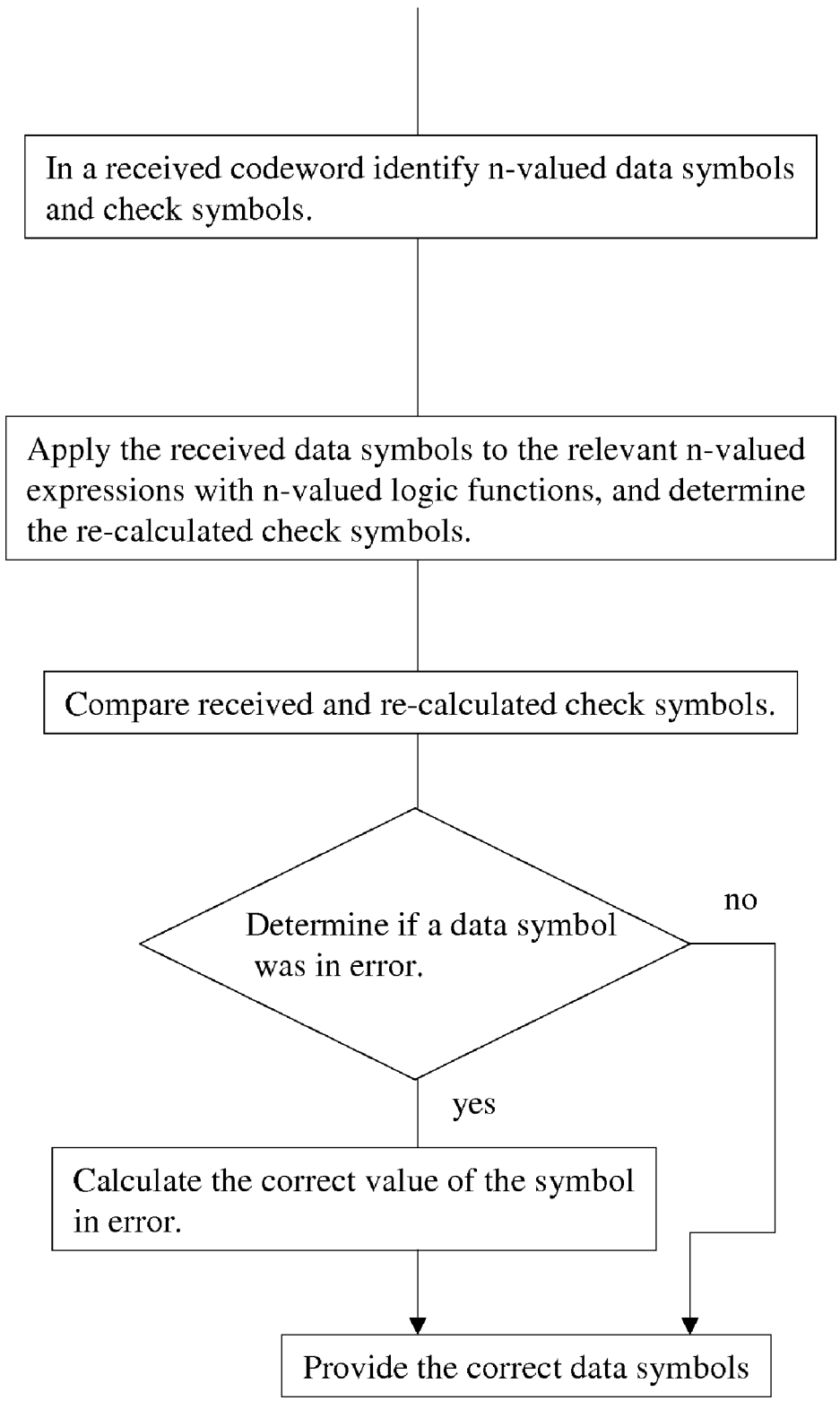
FIG. 4 illustrates in a flow diagram a method for correcting n-valued symbols in error.

FIG. 3 provides a flow diagram for creating an n-valued Hamming code. FIG. 4 provides a flow diagram for analyzing a received n-valued Hamming coded codeword and correcting up to one n-valued symbol in error.

While a Hamming code like the (7,4) or the (11,7) code fully use their check symbols, and they are very easy to code and decode, they are not very efficient codes in use of their overhead. For detecting more than 1 n-valued symbol in error it is easier and more efficient to interleave two or more Hamming codewords than adding overhead check symbols. For error correcting two or more errors directly in a single codeword for instance Reed Solomon (RS) codes may be more efficient. Unfortunately creating and solving RS-codes involve Linear Feedback Shift Registers (LFSRs) and fairly complex circuitry. If for instance a relatively low symbol error ratio is expected it may be too expensive to create short codewords with error correcting capabilities for 2 or more errors. It would mean that each codeword has to be analyzed, while in actuality just 1 in 100 codewords will have an error.

One may for instance code n-valued symbols into binary words of bits. An 8-valued symbol has then 3 bits. Even if an error occurs in just one symbol (and does not exceed 3 bits) it may fall into 2 adjacent 8-valued symbols. In that case using an interleaved n-valued Hamming code may be a good solution. Assume two (11,7) Hamming codewords [x1 x2 x3 x4 x5 x6 x7 p1 p2 p3 p4] and [y1 y2 y3 y4 y5 y6 y7 r1 r2 r3 r4], wherein p1, p2, p3, p4, r1, r2, r3 and r4 are n-valued check symbols. Creating an interleaved codeword [x1 y1 x2 y2 x3 y3 x4 y4 x5 y5 x6 y6 x7 y7 p1 r1 p2 r2 p3 r3 p4 r4] addresses the issue of two symbols in error. It should be clear that different arrangements of data symbols and check symbols can be beneficial. Because a single check symbol in error requires no data symbol recalculation, one can find arrangements of order of data symbols that require the fewest calculations and recalculations. Different order of position of data symbols and check symbols is fully contemplated as one aspect of the present invention.

If more adjacent errors are expected one can use more interleaved single codewords to create a combined interleaved codeword.

In some communication channels errors occur in bursts. For instance if it is known that errors occur in bursts of never more than 8 adjacent bits, it may be beneficial to create Hamming codewords of 16-valued symbols, interleave two codewords, and represent each symbol by 4-bits words. Some costs of this simple error correcting method involve the overhead cost of check symbols and cost of synchronization of words. Especially if a low symbol error ratio is expected one may lower the relative overhead rate by increasing the word size of the n-valued Hamming code.

In accordance with a further aspect of the present invention a method and apparatus will be provided to further simplify error detection and error correction by using n-valued logic functions and ordering n-valued data symbols in a matrix. As illustrative examples 2-dimensional matrices will be used. It should be appreciated that using 3-dimensional and higher dimensional matrices are also possible. Further more rectangular matrices will be used. Depending on the ordering of symbols one may use non-rectangular matrices. This will not materially affect the principles of the method and apparatus provided.

Two-dimensional binary parity check matrices are known. In some cases $GF(2^p)$ symbols in binary form are created wherein binary parity check symbols of individual bits are created for error detection and error correction purposes. It is believed that using two and multi dimensional matrices comprising n-valued data symbols and check symbols from data symbols by applying n-valued logic functions is novel. Also first identifying symbols in error and then correcting symbols by reversing check symbol expressions is believed to be novel.

FIG. 5 shows one way to organize n-valued data symbols for single error detection and correction. Assume a series of 18 n-valued data symbols d11 to d63. It should be clear that this is merely an illustrative example and that many different data symbols and their organization may be selected. The purpose is to find and correct a single error in these 18 data symbols for which check symbols will be generated. The symbols are organized in a matrix having 2 dimensions in this example, wherein a column has 6 data symbols and a row has 3 data symbols. Each row and each column has added a check symbol. The check symbols added to a row are named q and to a column are named p. The columns are provided with 6 symbols to illustrate the possible complexity of calculating an error corrected symbol if the applied logic functions are not associative. FIG. 6 illustrates one way how the data symbols can be organized in a matrix, starting at the top of the first column and going from the bottom of the next column back to the top and so on. If multiple adjacent errors are possible these errors may spill over into the next column. In that case organizing symbols as shown in FIG. 7 may be preferable, as adjacent errors will appears in different rows. The position of the check symbols p and q may be put anywhere in between the data symbols to break up adjacent errors. However they are put in the matrix in rows and columns to show how they are calculated. Additional check symbols like q4 which will provide a check on check symbols. (either on a row or on a column).

Assume that a column has n-valued data symbols [x1 x2 x3 x4 x5 x6]. Assume that one check symbol p is generated from the n-valued symbols. The simplest way to do this is if n is a power of 2 and one can use a self reversing, associative and commutative functions sc. In that case p=x1 sc x2 sc x3 sc x4 sc x5 sc x6. So if any of the symbols is in error it can easily be reconstructed. Assume in the matrix of FIG. 7 that p2 and q3 were in error. That means that x3 (d32) was in error in the column. One can recalculate x3 from x3=x1 sc x2 sc x4 sc x5 sc x6 sc p2. It appears to be easier to calculate x3 from fewer terms, using q3=(d31 sc1 d32) sc2 d33. However if sc1 and sc2 are non-associative, non-commutative logic functions, then order of execution is important and determining d32 may be a bit more involved. and look like:

$d32=d31\ sc1r^{-1}\ (q3\ sc2c^{-1}\ d33)$. Herein $sc1r^{-1}$ is the inverse of sc1 over constant rows and $sc2c^{-1}$ is the inverse of sc1 over constants columns.

How complicated the resolving expressions can become can be demonstrated with calculating check symbol p from 6 symbols. One can use of course other functions than an associative function. One expression then may be p=[{(x1 sc1 x2) sc2 (x3 sc4 x4)} sc5 (x5 sc6 x6)]. Even if one uses a single non-associative function sc there are different ways to calculate p. One way is: p1{([{(x1 sc x2) sc x3} sc x4] sc x5) sc x6}. Another way is p=[{(x1 sc x2) sc (x3 sc x4)} sc (x5 sc x6)]. For instance assume the self reversing non-associative 8-valued function sc of which the following truth table is provided.

| sc | 0 | 1 | 2 | 3 | 4 | 5 | 6 | 7 |
|---|---|---|---|---|---|---|---|---|
| 0 | 7 | 6 | 5 | 4 | 3 | 2 | 1 | 0 |
| 1 | 6 | 5 | 4 | 3 | 2 | 1 | 0 | 7 |
| 2 | 5 | 4 | 3 | 2 | 1 | 0 | 7 | 6 |
| 3 | 4 | 3 | 2 | 1 | 0 | 7 | 6 | 5 |
| 4 | 3 | 2 | 1 | 0 | 7 | 6 | 5 | 4 |
| 5 | 2 | 1 | 0 | 7 | 6 | 5 | 4 | 3 |
| 6 | 1 | 0 | 7 | 6 | 5 | 4 | 3 | 2 |
| 7 | 0 | 7 | 6 | 5 | 4 | 3 | 2 | 1 |

Further assume 8-valued data symbols [x1 x2 x3 x4 x5 x6]=[0 1 2 3 4 5]. The expression p11={([{(x1 sc x2) sc x3} sc x4] sc x5) sc x6} will generate p11=4. The expression p22=[{(x1 sc x2) sc (x3 sc x4)} sc (x5 sc x6)] will generate p22=2. It should be clear that for error detection it does not matter how expressions are structured. The main requirement for error detection is that a changed data symbol generates a changed check symbol. Both expressions comply with that requirement. However re-calculating a symbol when its error position is known in both situations is different.

As an illustrative example assume x3 is known to be in error. To calculate x3 from p11 will provide: x3=[{(p11 sc x6) sc x5} sc x4] sc (x1 sc x2)=2. Using p11=2 instead of p11=4 would provide x3=0, which of course is wrong.

To calculate x3 from p22 will provide: x3=[{p22 sc (x5 sc x6)} sc (x1 sc x2)] sc x4 with x3=2. Using p22=4 instead of p22=2 would provide x3=0 which is wrong.

Accordingly one may select as part of the error detecting an expression for determining a check symbol that applies one or more identical or different logic functions. Determining if an error has occurred requires recalculating the check symbol.

Determining the correct value of a symbol in error requires first determining the expression for calculating the data symbol. That expression depends on the properties of the functions and may become quite elaborate, especially if functions are non-commutative and not self reversing and if the expression involves a substantial number of data symbols. In the 8-valued case there are 8!=40,320 reversible inverters. Each reversible logic function has 8 columns and rows wherein a column or a row is a reversible inverter as explained by the inventor in U.S. patent application Ser. No. 10/935,960, filed Sep. 8, 2004, entitled TERNARY AND MULTI-VALUE DIGITAL SCRAMBLERS, DESCRAMBLERS AND SEQUENCE GENERATORS, which is incorporated herein by reference in its entirety. It will be appreciated that determining the actual expressions, whereby possibly no order x1, x2, x3, x4, . . . is maintained, from the check symbols will become quite involved.

In accordance with a further aspect of the present invention one may provide security to data by not publicly disclosing the expression for check symbol creation and by inserting one error into a data symbol after a check symbol has been created. If one does this at a fairly high symbol error ratio then the received data, for instance if it represents a video signal can still be viewed, but will demonstrate significant quality deterioration. In such situations one can have somebody view the video at low quality. However without the proper error correction expression one can not correct the occurring errors. This annoyance factor may be high especially in for instance high definition video, where errors may show up as having severely numbers of faulty pixels in a screen. It is contemplated that a user can obtain or download the error correcting expression from an authorized provider. Other types of signals using protected errors as annoyance to discourage unauthorized use, such as digital audio and music files as well as other data files are fully contemplated. A condition would be that the error correction of a code has to be able to address the artificially inserted errors as well as errors experienced during transmission and receiving.

Insertion of annoyance errors should take place after calculating the check symbols and before experiencing 'real' errors. Errors may be introduced at the same position. Also multiple errors may be introduced. In order to have deliberate annoyance errors not corrected the decoder should have a deliberately not matching decoder. This means that an annoyance error will not be corrected appropriately. By providing the correct solver or decoder for errors in a specific position one may allow correction of the annoyance errors.

FIG. 8 shows a method of coding wherein two adjacent errors may be detected. The data word comprising n-valued data symbols is [d1 m1 d2 m2 d3 m3 . . . d12 m12]. The data word is ordered into 3 columns, each column comprising 8 data symbols. The data symbols are identified in such a way that the symbols 'd' in odd positions are assigned to a first check symbol, for instance 'p', while the even position symbols 'm' are assigned to a second check symbol 'r'. Each row of the matrix is assigned to a check symbol 'q'. Additional check symbols may be used to check the check symbols. The illustrative scheme as shown in FIG. 8 allows detecting more than 1 error in a dataword by using simple check symbol expressions. It is easy to see that 2 or more errors using simple check symbol expressions may cancel each other out. It should also be clear that the same approach of creating additional check symbols by symbol interleaving can be used for the rows in a matrix, or along any other dimension of a matrix.

As an example one can detect the location of two adjacent errors in the word [d5 m5 d6 m6 d7 m7 d8 m8] by using check symbols r2, p2, q3 and q4. It should be clear that non adjacent errors, for instance in d5 and d6 may not be detected in this manner.

Figure 9:
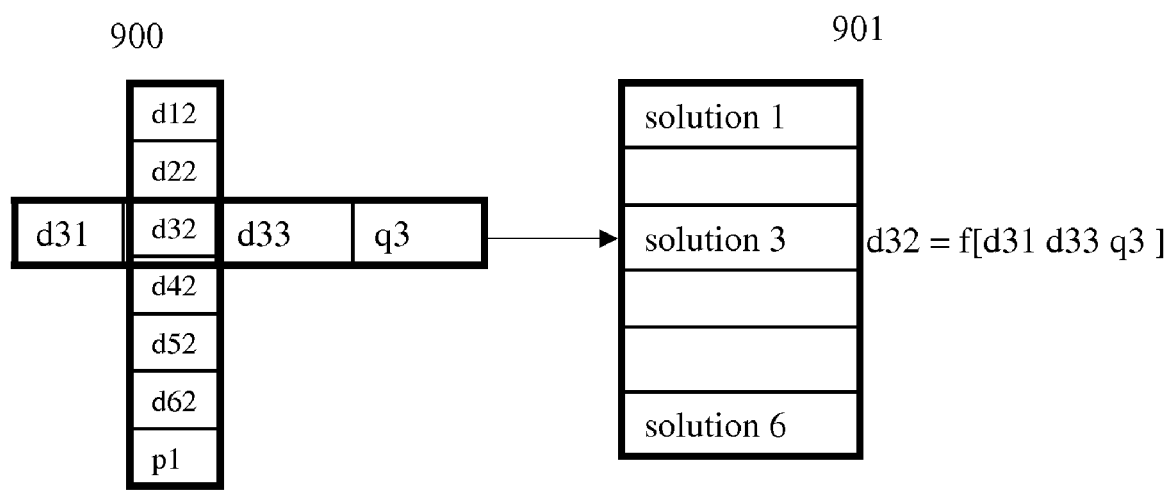
FIG. 9 shows in diagram a relation between data symbols and a check symbol.

FIG. 9 shows how a symbol in error may be corrected. Assume the matrix of FIG. 7, wherein p2 and q3 were assumed to be detected in error. FIG. 9 shows how for every row in a coding matrix, depending on the column, as shown in FIG. 9 as 900, a solution comprised of a solving n-valued expression is available in 901. The solver 901 may for instance be a series of instructions in a processor representing the execution of an appropriate expression. This series of instructions is provided as input with n-valued symbols d31, d33 and q3, which will generate d32, which was in error.

Figure 10:
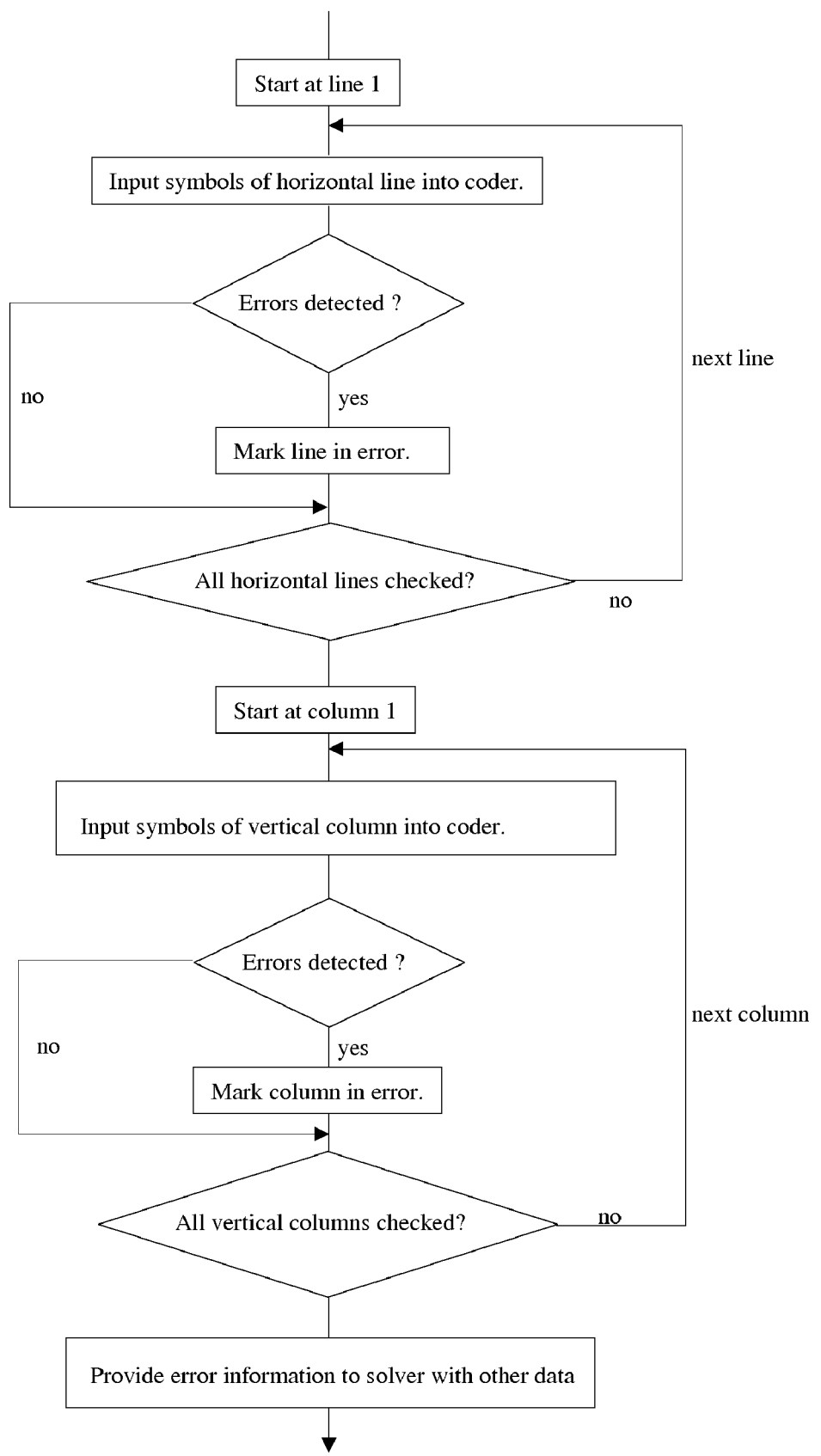
FIG. 10 is a flow diagram illustrating a method for detecting errors.

FIG. 10 shows a flow diagram of checking all columns and rows on errors and providing the identification of error position to the solver, together with appropriate data to solve an expression.

The methods provided here apply n-valued expressions using one or more equal or different n-valued logic functions on n-valued symbols. In a first check symbol expression an n-valued symbol only appears once. One could articulate this as: in the expression p=ax1 sc bx2 sc cx3 . . . sc gx4 all coefficients a, b . . . g have the value 1 or the equivalent in n-valued logic, being an identity inverter.

In a second expression the coefficients may not all be 1, but none is 0. However a restriction has to be that ax1 is unique (ax1 means a×x1). This means that if x1=e1 or x1=e2 that axe1 is never identical to axe2. For instance if one is considering 8-valued symbols and one is using 2×x1 as a term in an 8-valued expression wherein 2 is the modulo-8 multiplication by 2, then 2×2=4 modulo-8 but 2×6 modulo-8 is also 4. This means that an error in x1 wherein x1 was 2 but is replaced by 6 will not be detected. This is the fundamental problem for detecting 2 or more errors in sequences of binary symbols using just single check symbols. Adding a parity symbol based on the same data symbols will not always extend error detection. It is a further aspect of the present invention to increase detection of symbols in error in a sequence of n-valued data symbols by increasing the number of check symbols, wherein each check symbol is created from an expression applying the same number of data symbols, but in each expression related to a check symbol a data symbol may be multiplied by a different coefficient. In order to prevent undetectable errors multiplication should exist within GF(n). In order to be able to correct two or more errors one should create at least two independent expressions for the 'unknowns' which are the to be solved errors. The problem with binary expressions of course is that a binary coefficient multiplier can only be 1 as non-zero multiplier. This effect ultimately then also explains why in Reed Solomon codes one needs an LFSR wherein the n-valued logic is preferably greater than the number of shift register elements.

Because one will work with multipliers in n-valued expressions, it is likely that one also is required to apply n-valued division in order to solve expressions. From a n-valued logical point of view division in n-valued logic is the inverter that reverses a n-valued multiplication. For illustrative purposes 8-valued examples will be provided. It should be clear that similar approaches in GF(n) can also be created.

First addition and multiplication in GF(8) will be established. The following tables provide the truth tables of the two required functions.

| + | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 1 | 0 | 4 | 7 | 2 | 6 | 5 | 3 |
| 2 | 2 | 4 | 0 | 5 | 1 | 3 | 7 | 6 |
| 3 | 3 | 7 | 5 | 0 | 6 | 2 | 4 | 1 |
| 4 | 4 | 2 | 1 | 6 | 0 | 7 | 3 | 5 |
| 5 | 5 | 6 | 3 | 2 | 7 | 0 | 1 | 4 |
| 6 | 6 | 5 | 7 | 4 | 3 | 1 | 0 | 2 |
| 7 | 7 | 3 | 6 | 1 | 5 | 4 | 2 | 0 |

| × | 0 | 1 | 2 | 3 | 4 | 5 | 6 | 7 |
|---|---|---|---|---|---|---|---|---|
| 0 | 0 | 0 | 0 | 0 | 0 | 0 | 0 | 0 |
| 1 | 0 | 1 | 2 | 3 | 4 | 5 | 6 | 7 |
| 2 | 0 | 2 | 3 | 4 | 5 | 6 | 7 | 1 |
| 3 | 0 | 3 | 4 | 5 | 6 | 7 | 1 | 2 |
| 4 | 0 | 4 | 5 | 6 | 7 | 1 | 2 | 3 |
| 5 | 0 | 5 | 6 | 7 | 1 | 2 | 3 | 4 |
| 6 | 0 | 6 | 7 | 1 | 2 | 3 | 4 | 5 |
| 7 | 0 | 7 | 1 | 2 | 3 | 4 | 5 | 6 |

The following table shows the division rule in $GF(2^3)$.

| ÷ | 1 | 2 | 3 | 4 | 5 | 6 | 7 |
|---|---|---|---|---|---|---|---|
| × | 1 | 7 | 6 | 5 | 4 | 3 | 2 |

From this one can easily check that for instance division by 2 in $GF(2^3)$ is the same as multiplication by 7.

Assume generating two 8-valued check symbols p1 and p2. The following expressions will be used applying 4 8-valued data symbols [x1 x2 x3 x4]=[1 2 3 4]: p1=x1+2×2+3×3+4×4 and p2=3×1+x2+4×3+5×4. Herein + is the addition in GF(8) as provided in the above truth table. A further assumption is that by arranging data symbols in a matrix and by using check symbols one can identify which symbols are in error. Assume that x1 and x2 were detected being in error.

The check symbols are: p1=5 and p2=0. This will provide the following expressions: x1+2×2+3.3+4.4=5 or x1+2×2+5+7=5 or x1+2×2+4=5. Keep in mind that + is self reversing and associative, thus x1+2×2=4+5=7. Further: 3×1+x2+4.3+5.4=0 or 3×1+x2+6+1=0 or 3×1+x2=5. So one has to solve the set x1+2×2=7 and 3×1+x2=5 in GF(8). That will generate (as expected) x1=1. The same approach applies to x2 and will generate x2=2.

The requirement for error detection in a codeword with the generation of check symbols as provided here is that two or more symbols in error will not create all check symbols to be equal to the ones when no errors have occurred. In such a situation one is unable to detect multiple errors.

The advantage of the new method for error detection using multipliers is that no interleaving is required and no extra step is required to distinguish and separate different sequences of data symbols. One may actually circumvent use of multipliers by combining multipliers with adders according to a method disclosed in U.S. patent application Ser. No. 10/935,960, filed Sep. 8, 2004, entitled TERNARY AND MULTI-VALUE DIGITAL SCRAMBLERS, DESCRAMBLERS AND SEQUENCE GENERATORS.

The following 5-valued expressions can be used to check on 2 adjacent errors in [x1 x2 x3 x4]:

x1+4×2+3×3+2×4=p1

2×1+2×2+2×3+x4=p2. Herein + is mod-5 addition and * is mod-5 multiplication.

After detecting errors one can error correct in two ways: solve a set of equations for the word with the multiple errors. If one detects errors with single error check symbols one can solve each individual error. Solving multiple errors from a set of equations may require either more calculations or storage of solving equations. The advantage is that the solutions can be generated in a limited number of steps. One way to limit computations may be to leave out certain variables, as long as each variable shows of course up in one check symbol.

With this it has been demonstrated that methods of k errors correction in a sequence of p symbols has been by providing by first detecting errors and then solving k n-valued expressions for k n-valued error checking symbols created over p n-valued data symbols. One may keep on adding n-valued check symbols, created by different n-valued expressions. The limitation for solving equations for error correction is the independency of the equations for the to be solved unknowns. The limitation is less stringent for adjacent errors. For instance assume that a word of n-valued data symbols is [x1 x2 x3 x4 x5 x6 x7 x8 x9 x10]. To solve errors in any of 3 symbols puts much more severe restrictions on the expressions than solving for 3 adjacent errors.

An additional benefit is that each check symbol in an expression is independent from any other check symbol. That means that a check symbol in error only contributes as an unknown in one expression.

N-valued check symbols are known to be generated by LFSRs in for instance Reed Solomon codes. However in general these check symbols are treated as residues of a division, not as part of an n-valued expression. The here provided analysis and methods are believed to be novel. The subject of n-valued LFSRs and n-valued expressions is dealt with elsewhere by the inventor, for instance in U.S. patent application Ser. No. 11/566,725 filed Dec. 5, 2006 entitled ERROR CORRECTING DECODING FOR CONVOLUTIONAL AND RECURSIVE SYSTEMATIC CONVOLUTIONAL ENCODED SEQUENCES, which is incorporated herein by reference in its entirety.

Re-calculating check symbols in binary art usually take place after transmission or substantial processing of the symbols. For the purpose of aspects of the present invention re-calculating of check symbols may take place after each step, also called transmission step, in which an error in a symbol may have occurred. This may be in for instance after reading from an optical disk, scanning of a bar-code, transmission of a signal. Accordingly recalculation may occur in a place or apparatus different from where the original calculation took place. However it may also occur in the same apparatus or place, after a step, a processing step or transmission step that may introduce errors.

The term n-valued expression used herein means an algebraic expression that is created in a non-recursive manner. LFSRs determine the set of expressions that is to be executed, wherein at each clock cycle an expression is evaluated. This has potentially several draw backs. First of all an LFSR is a serial execution; one has to execute by clock pulse, using previous results to generate a new result. It may be easier and faster to execute the expressions in parallel by dedicated circuitry. Secondly one cannot easily create expressions that meet specific error expectations (such as 2 or more adjacent errors in a sequence of data symbols). Accordingly methods using N-valued LFSRs are excluded unless they are specifically included.

Figure 11:
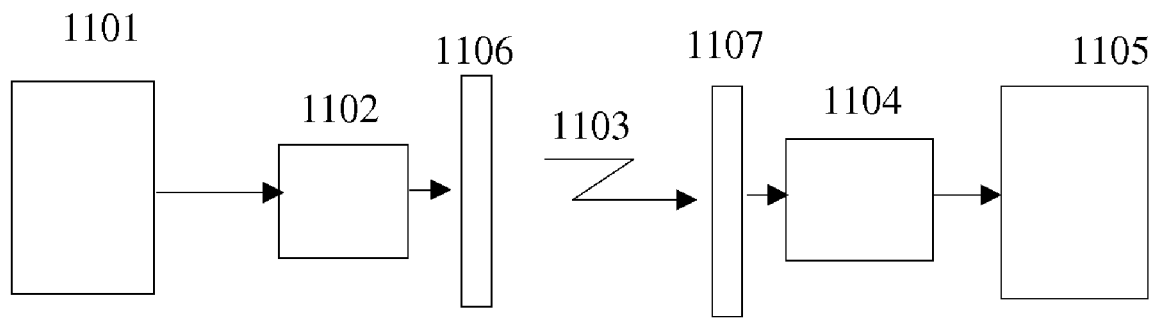
FIG. 11 illustrates a communication system in accordance with an aspect of the present invention.

In accordance with a further aspect of the present invention the here provided methods of error correction by error detection and symbol reconstruction can be used in a system, such as a communication system. Such a system may be a wired system or a wireless system. Such a system may be used for data transmission, telephony, video or any other type of transfer of information. A diagram of such a system is provided in FIG. 11. Herein 1101 is a source of information. The information is provided to a coder 1102. The information provided to a coder 1102 may already be in a digital form. It may also be converted into digital form by the coder 1102. The coder 1102 creates the code words of a plurality of data symbols with added check symbols as described herein as another aspect of the present invention. The codewords are organized in such a way that up to a number of symbols in error can be identified as such. The thus created codewords may be provided directly to a medium 1103 for transmission. They may also be provided to a modulator/transmitter 1106 that will modify the digital coded signal provided by 1102 to a form that is appropriate for the medium 1103. For instance 1106 may create an optical signal or an electrical signal. Modulator 1106 may also be a radio transmitter, which will modulate the signal on for instance a carrier signal, and wherein 1103 is a radio connection.

At the receiving side a receiver 1107 may receive, amplify, and demodulate the signal coming from 1103 and provide a digital signal to a decoder 1104. The decoder 1104 identifies if and which symbols are in error in accordance with another aspect of the present invention and then applies the methods provided herein to correct symbols in error. A decoded and error corrected signal is then provided to a target 1105. Such a target may be a radio, a phone, a computer, a tv set or any other device that can be a target for an information signal. A coder 1102 may also provide additional coding means, for instance to form a concatenated or combined code. In that case the decoder 1104 has equivalent means to decode the additional coding. Additional information, such as synchronization or ID information, may be inserted during the transmission and/or coding process.

In accordance with another aspect of the present invention the here provided methods and apparatus for error correcting coding and decoding of signals can also be applied for systems and apparatus for storage of information. For instance data stored on a CD, a DVD, a magnetic tape or disk or in mass memory in general may benefit from error correcting coding. A system for storing error correcting symbols in accordance with another aspect of the present invention is shown in diagram in FIG. 12. A source 1201 provides the information to be coded. This may be audio, video or any information data. The data may already be presented in n-valued symbols by 1201 or may be coded in such a form by 1202. Unit 1202 also creates the code words of a plurality of data symbols with added check symbols as described herein as another aspect of the present invention. Codewords are organized in such a way that up to a number of symbols in error can be identified as such. The thus created codewords may be provided directly to a channel 1204 for transmission to an information carrier 1205. The information carrier 1205 may be an optical disk, an electro-optical disk, a magnetic disk, a magnetic tape, a flash memory device or any other device or medium that can store information. In general a modulator/data writer 1203 will be required to write a signal to a carrier 1205. For instance the channel may require optical signals, electrical signals or it may require magnetic or electro-magnetic or electro-optical signals. Modulator/data writer 1203 will create a signal that can be written via channel 1204 to a carrier 1205. Additional information such as for ID and/or synchronization may be added to the data.

Figure 12:
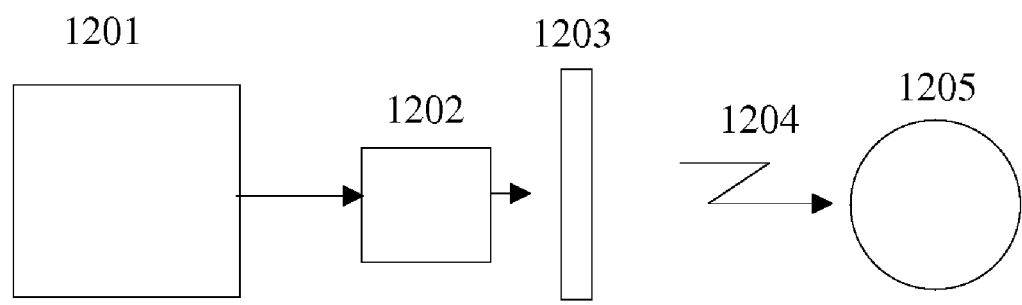
FIG. 12 illustrates part of a data storage system in accordance with an aspect of the present invention.
Figure 13:
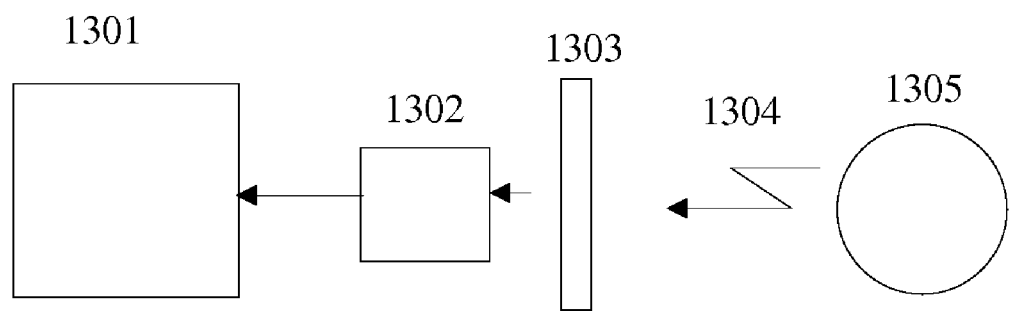
FIG. 13 illustrates another part of a data storage system in accordance with another aspect of the present invention.

FIG. 13 shows a diagram for error correcting decoding information read from a carrier 1305, identical to 1205 in FIG. 12. The information is read through a channel 1304 (such as an optical channel or electrical or magnetic or electro-magnetic or electro-optical channel) and provided in general to a detector 1303 that will receive and may amplify and or demodulate the signal. The signal is then provided to a decoder 1302 where error detection and error correction takes place. The information signal, possibly readied for presentation as an audio or video signal or any other form is then provided to a target. The target may be a video screen, a computer, a radio or any other device that can use the decoded signal.

It should be appreciated that while illustrative examples on determining n-valued check symbols are using 2 dimensional matrices, also more dimensional matrices can be used. Furthermore it is not required to determine a check symbol strictly along a dimension of a matrix. One may jump rows, columns or other dimensions, as long as the same rules for determining check symbols are used at coding and decoding.

The methods and apparatus here provided can be implemented using a general processor, a dedicated signal processor or customized logic. N-valued symbols may be processed as binary words, being created from n-valued symbols by Analog/Digital converters. After being processed n-valued signals may be created from binary words by applying Digital/Analog converters. Switching functions may be created as customized n-valued circuits. For instance U.S. Pat. No. 6,133,754 by Olson, issued Oct. 17, 2000 entitled "Multiple-valued logic circuit architecture; supplementary symmetrical logic circuit structure (SUS-LOC)" discloses embodiments of n-valued CMOS switches. In U.S. patent application Ser. No. 11/000,218 filed Nov. 30, 2004 entitled "Single and composite binary and multi-valued logic functions from gates and inverters" which is incorporated herein by reference in its entirety, it is shown how n-valued logic circuits can be created. N-valued logic embodiments, for instance using look-up tables are also contemplated.

In the examples of creating n-valued check symbols n-valued reversible logic functions are used in expressions. The use of reversible logic functions is required for solving equations. It should be clear that for only detecting errors one may use non-reversible logic functions. For instance one may want to detect errors only in data symbols in certain states, so recalculating a check symbol with a certain state in error will create a new value in a check symbol. Accordingly the use of non-reversible n-valued logic functions for error detection is fully contemplated.

It should be clear from the above that one purpose is to create optimal expressions for generating single n-valued check symbols. It should be clear to one skilled in the art that one can create expressions that comprise binary variables (able to assume one of two values) that will create binary check symbols by using non-binary multiplications. For instance in the binary case one could apply the expressions x1+2×2+3×3=a, and 2×1+3×2+2×3=b and x1+x2+x3=c. Herein one should calculate

| x1 | x2 | x3 | x1 + 2x2 + 3x3 | 2x1 + 3x2 + 2x3 | x1 + x2 + x3 | a mod-2 | b mod-2 | c mod-2 |
|----|----|----|----------------|-----------------|--------------|---------|---------|---------|
| 0  | 0  | 0  | 0              | 0               | 0            | 0       | 0       | 0       |
| 0  | 0  | 1  | 3              | 2               | 1            | 1       | 0       | 1       |
| 0  | 1  | 0  | 2              | 3               | 1            | 0       | 1       | 1       |
| 0  | 1  | 1  | 5              | 5               | 2            | 1       | 1       | 0       |
| 1  | 0  | 0  | 1              | 2               | 1            | 1       | 0       | 1       |
| 1  | 0  | 1  | 4              | 4               | 2            | 0       | 0       | 0       |
| 1  | 1  | 0  | 3              | 5               | 2            | 1       | 1       | 0       |
| 1  | 1  | 1  | 6              | 7               | 3            | 0       | 1       | 1       |

Using these expressions (with coefficients greater than 2) in the binary case for creating check symbols will only work for finding unique errors and solving for errors if one uses check symbols that may have a value greater than 2, and accordingly have to be multi-bits words. For instance one can create independent equations if the check symbols are calculated to be for instance modulo 4 (or 2 bits). In fact the method of extending the size of n-valued check symbols to represent k-valued symbols wherein k>n, which is a further aspect of the present invention, may be compared in relevant cases to having an n-valued LFSR run for additional clock cycles to increase the Hamming distance between codewords.

The following patent applications, including the specifications, claims and drawings, are hereby incorporated by reference herein, as if they were fully set forth herein: (1) U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS; (2) U.S. Pat. No. 7,002,490 by Lablans, issued Feb. 21, 2006, entitled TERNARY AND HIGHER MULTI-VALUE SCRAMBLERS/DESCRAMBLERS; (3) U.S. patent application Ser. No. 11/000,218, filed Nov. 30, 2004, entitled SINGLE AND COMPOSITE BINARY AND MULTI-VALUED LOGIC FUNCTIONS FROM GATES AND INVERTERS; (4) U.S. Provisional Patent Application No. 60/599,781, filed Aug. 7, 2004, entitled MULTI-VALUED DIGITAL INFORMATION RETAINING ELEMENTS AND MEMORY DEVICES; and (5) U.S. patent application Ser. No. 11/566,725 filed Dec. 5, 2006, entitled ERROR CORRECTING DECODING FOR CONVOLUTIONAL AND RECURSIVE SYSTEMATIC CONVOLUTIONAL ENCODED SEQUENCES.

While there have been shown, described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

The invention claimed is:

1. A method for correction of at least 1 and up to p symbols in error in a plurality of n-valued data symbols and p check symbols with n>2 and p≧1, comprising:
   receiving a check symbol that was generated by a generating step that includes executing an n-valued expression applying at least one reversible non-commutative n-valued logic function with at least two of the plurality of n-valued data symbols as variables; and
   correcting by a processor of the at least 1 and up to p symbols in error in the plurality of n-valued data symbols and p check symbols by solving one or more n-valued equations, wherein a symbol in error is an unknown variable and wherein a symbol is represented by a signal.

2. The method of claim 1, wherein p>1.

3. The method of claim 1, further comprising:
   associating the plurality of n-valued data symbols with a matrix having rows and columns, each row and column of the matrix that includes an n-valued data symbol from the plurality of data symbols including at least one check symbol generated by an n-valued expression.

4. The method as claimed in claim 1, wherein the method is applied in a communication system.

5. The method as claimed in claim 1, wherein the method is applied in a data storage system.

6. The method as claimed in claim 1, wherein at least one of the at least 1 and up to p symbols in error was an error-free symbol that has been deliberately changed into an error as an annoyance error.

7. The method as claimed in claim 6, wherein an n-valued logic expression that will correct the deliberately changed symbol in error was not available to a decoder that receives the deliberately changed symbol and subsequently has been made available to the decoder.

8. The method as claimed in claim 1, further comprising:
   creating by the processor of a codeword comprising:
   the plurality of n-valued data symbols;
   the p check symbols;
   at least one additional n-valued data symbol; and
   at least one additional check symbol, wherein the at least one additional check symbol is generated by an n-valued expression having the at least one additional n-valued data symbol as a variable and which does not occur as a variable in an n-valued expression for generating at least one of the p check symbols.

9. The method of claim 1, wherein an n-valued symbol is represented by a plurality of binary symbols.

10. A system for correction of at least 1 and up to p symbols in error in a plurality of n-valued data symbols with n>2 and p≧1, comprising:
   a processor;
   instructions executable by the processor for performing the steps of:
   receiving the p check symbols, at least one of the p check symbols being generated by a generating step that includes executing an n-valued expression applying at least one reversible non-commutative n-valued logic function with at least two of the plurality of n-valued data symbols as variables; and
   correcting the at least 1 and up to p symbols in error in the plurality of n-valued data symbols and p check symbols by solving one or more n-valued equations wherein a symbol in error is an unknown variable.

11. The system of claim 10, wherein p>1.

12. The system of claim 10, further comprising the step of: associating the plurality of n-valued data symbols with a matrix having rows and columns, each row and column of the matrix that includes an n-valued data symbol from the plurality of data symbols including at least one check symbol generated by an n-valued expression.

13. The system as claimed in claim 10, wherein the system is a communication system.

14. The system as claimed in claim 10, wherein the system is a data storage system.

15. The system as claimed in claim 10, wherein at least one of the at least 1 and up to p symbols in error was an error-free symbol that has been deliberately changed into an error as an annoyance error.

16. The system as claimed in claim 15, wherein an n-valued logic expression that will correct the deliberately changed symbol in error was not available to a decoder and subsequently has been made available to the decoder.

17. The system of claim 10, wherein an n-valued symbol is represented by a plurality of binary symbols.

* * * * *